United States Patent
Hodel et al.

(10) Patent No.: US 11,604,632 B2
(45) Date of Patent: Mar. 14, 2023

(54) DEVELOPMENT ENVIRONMENT DEPLOYMENT FOR MULTIPLE DEVELOPER TYPES

(71) Applicant: Fastly, Inc., San Francisco, CA (US)

(72) Inventors: Eric Hodel, Seattle, WA (US); Ezekiel Templin, Oakland, CA (US)

(73) Assignee: Fastly, Inc., San Francisco, CA (US)

( * ) Notice: Subject to any disclaimer, the term of this patent is extended or adjusted under 35 U.S.C. 154(b) by 239 days.

(21) Appl. No.: 16/851,793

(22) Filed: Apr. 17, 2020

(65) Prior Publication Data

US 2021/0325785 A1 Oct. 21, 2021

(51) Int. Cl.
*G06F 8/61* (2018.01)
*G03F 7/20* (2006.01)
*G06F 8/65* (2018.01)
*G06F 9/455* (2018.01)
*G06F 9/50* (2006.01)
*G06F 8/00* (2018.01)

(52) U.S. Cl.
CPC .............. *G06F 8/63* (2013.01); *G03F 7/2024* (2013.01); *G03F 7/70491* (2013.01); *G06F 8/00* (2013.01); *G06F 8/65* (2013.01); *G06F 9/455* (2013.01); *G06F 9/5066* (2013.01)

(58) Field of Classification Search
USPC ........................................................ 717/100
See application file for complete search history.

(56) References Cited

U.S. PATENT DOCUMENTS

| 9,134,962 | B1* | 9/2015 | Stephens | G06F 8/70 |
| 9,792,141 | B1* | 10/2017 | Sethuramalingam | G06F 8/63 |
| 2001/0052110 | A1* | 12/2001 | Orbanes | G06F 16/954 717/100 |
| 2014/0188676 | A1* | 7/2014 | Marmolejo-Meillon | H04L 63/08 726/5 |
| 2016/0197803 | A1* | 7/2016 | Talbot | G06F 8/30 709/224 |
| 2016/0274885 | A1* | 9/2016 | Srinivasan | G06F 9/451 |
| 2017/0269921 | A1* | 9/2017 | Martin Vicente | G06F 8/61 |
| 2018/0321993 | A1* | 11/2018 | McClory | G06F 9/505 |
| 2019/0028336 | A1* | 1/2019 | Coronado | H04L 67/34 |

\* cited by examiner

*Primary Examiner* — Qing Chen
*Assistant Examiner* — Clint Thatcher

(57) ABSTRACT

Disclosed herein are systems, methods, and software managing the deployment of development environments for an organization. In one example, a computing system may identify a request for a development environment. In response to the request, the computing system may select one or more images for the development environment from a plurality of images based on an identifier associated with the request and initiate one or more virtual nodes from the one or more images based on a configuration associated with the identifier.

18 Claims, 6 Drawing Sheets

DEVELOPMENT ENVIRONMENT DEPLOYMENT FOR MULTIPLE DEVELOPER TYPES

BACKGROUND

A development environment is a collection of procedures and tools for developing, testing, and debugging an application. For example, a development environment may include a plurality of services that each interact with one another to provide a desired operation. These services may each execute across one or more virtual nodes, such as containers, virtual machines, or other containerized endpoints that can be deployed from images associated with a developer. The services may comprise database services, front-end application services, log services, or some other service, wherein the services may operate independently or depend on one or more other services.

In some implementations, as an organization grows, the different services and dependencies between the services may become complex causing issues when generating a new development environment. As an example, a developer may be required to identify relevant images for an environment, initiate the images as one or more virtual nodes, and configure the virtual nodes to provide the desired operations. As a result, the developer may be required to take an undesirable amount of time in generating the environment before performing any work in relation to the environment.

OVERVIEW

Technology is disclosed herein for managing and deploying development environments. In one example, a method includes identifying a request for a development environment and selecting one or more images for the development environment from a plurality of images based on a development identifier associated with the request. The method further includes initiating one or more virtual nodes from each of the one or more images based on a configuration associated with the developer identifier.

BRIEF DESCRIPTION OF THE DRAWINGS

The following description and associated figures teach the best mode of the invention. For the purpose of teaching inventive principles, some conventional aspects of the best mode can be simplified or omitted. The following claims specify the scope of the invention. Note that some aspects of the best mode cannot fall within the scope of the invention as specified by the claims. Thus, those skilled in the art will appreciate variations from the best mode that fall within the scope of the invention. Those skilled in the art will appreciate that the features described below can be combined in various ways to form multiple variations of the invention. As a result, the invention is not limited to the specific examples described below, but only by the claims and their equivalents.

DESCRIPTION

Figure 1:
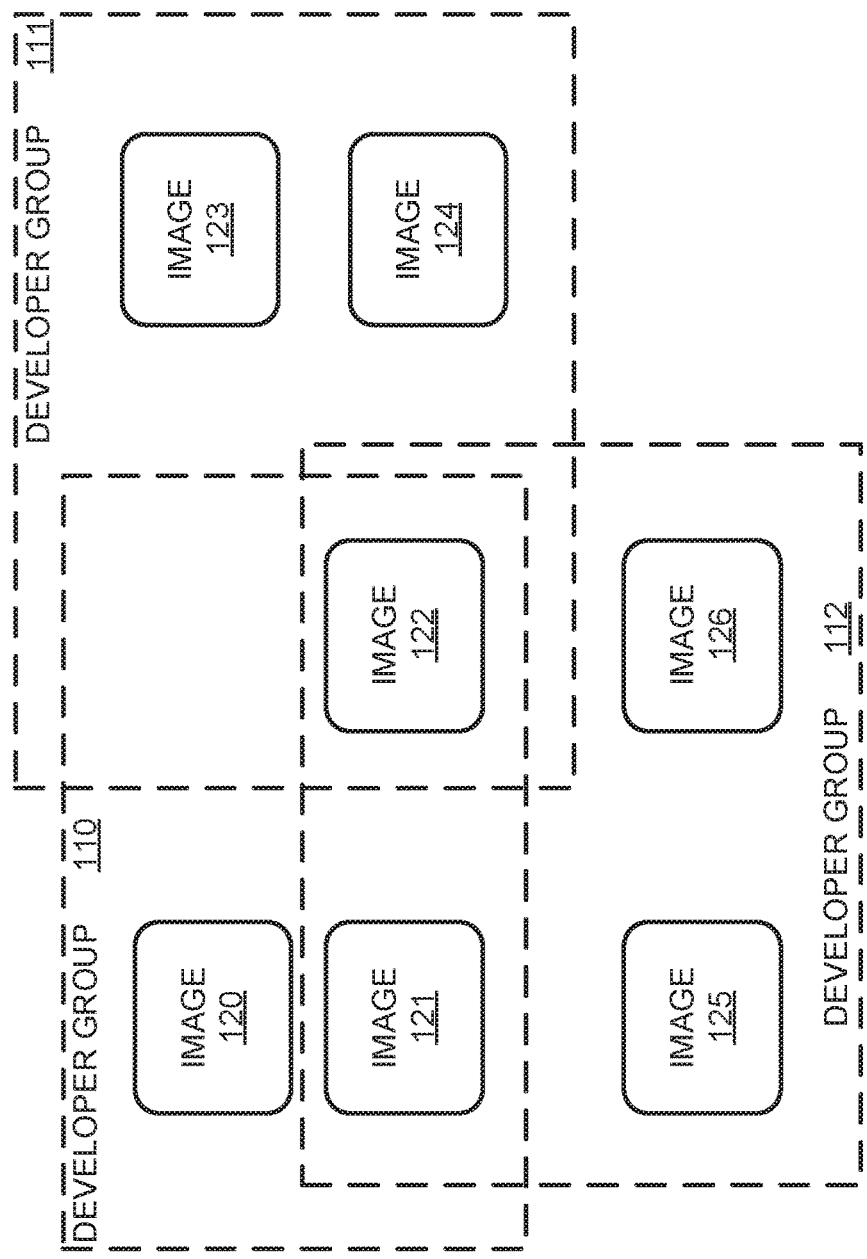
FIG. 1 illustrates a developer group topology for an organization according to an implementation.

Technology is disclosed herein for managing the development environments for multiple developers of an organization. In an implementation, a computing environment may be responsible for providing development environments for developers of an organization, wherein each of the developers may be responsible for a different portion of the organization's software. In particular, while a first developer may require a first set of services to develop the required software, a second developer may require a second set of services that depend on at least one of the services associated with the first developer. Each of the services may comprise one or more virtual nodes, such as containers, virtual machines, or some other containerized endpoint to provide the required service.

In at least one implementation, a computing environment may maintain a repository of images, of which one or more of the images may be allocated or available to a particular developer type. For example, while a first set of images may be associated with a developer of a first type, such as database developer, another set of images may be associated with a developer of a second type, such as front-end services developer. As a result, when the first developer requests a development environment, the first developer may be provided with services (each with one or more virtual nodes) derived from a set of images that may be different than the second developer. In some examples, at least one image may be shared across multiple types of developers, wherein the service generated using the at least one image is required for multiple developers of the organization's software platform.

As an illustrative example, a developer may generate a request for a new development environment to be provided by a computing system, wherein the request includes a developer identifier for the developer associated with the request. The identifier for the developer may include a username, password, developer group identifier, or some other identification for the required services of the developer. In response to the request, a computing system may identify one or more images associated with the developer identifier and initiate execution of virtual nodes to support the request from the one or more images. In at least one implementation, a configuration associated with the developer identifier may be used to provide various configuration information about the execution of the images. The configuration information may include dependency information for initiating execution of the various virtual nodes, locations of libraries and other dependencies to be loaded by the virtual nodes, communication requirements of the virtual nodes, functions or commands to be executed in the one or more virtual nodes that provide the service(s), or some other configuration information for deploying the development environment. For example, a configuration for a developer may indicate that a first service comprising one or more virtual nodes executed from a first image are dependent on a second service comprising one or more virtual nodes executed from a second image. As a result, when configuring the development environment, the computing system may initiate the second service and, once completed, initiate the first service, wherein the first service may be provided with information to communicate with the second service, credential to access the second service, or some other depen-
dent information. The services may be executed on a server
computer, on a local computer to the developer, or at some
other computing system.

Once a development environment is generated, the developer may generate updates to both the configuration of the services and the operations within the services. These configuration changes may include adding or changing libraries accessible by the services, changing dependencies for the services, updating code associated with the image for the services, or providing some other modification to the services. In response to a modification, the developer may commit the changes, which may permit updates to the configuration file or files for the development environment and may update code or libraries available to the each of the images. In the example where a service is available to multiple developer types, an update may also be generated for the configuration for the other developer types, such that they have access to the same image and/or image configuration.

FIG. 1 illustrates a developer group topology 100 for an organization according to an implementation. Topology 100 includes developer groups 110-112, which each may include one or more developers. Developer groups 110-112 share image 122 and developer groups 110 and 112 share image 121. Developer group 110 further includes image 120, developer group 111 further includes images 123-124, and developer group 112 further includes images 125-126.

Images 120-126 are representative of images that can be used to generate services for developer groups 110-112. Each image may include code, libraries, or some other resource for the service, and wherein each image may be deployed as one or more virtual nodes, such as Docker containers, Java containers, or some other container, or may comprise virtual machines in some examples. In some implementations, a service may require a deployment of multiple virtual nodes derived from a single image, wherein a first virtual node may provide a first operation, while the other virtual nodes provide other operations in support of the first virtual node.

Although not depicted in developer groups 110-112, each of the developer groups may be associated with a configuration that can comprise one or more files, scripts, or other configuration data for the services associated with a development environment. The configuration may indicate dependencies between the different services, functions or commands to be executed for each of the services, libraries available to each of the services, or some other configuration information. For example, if a developer associated with developer group 110 initiates a request for a development environment, the computing system may identify images 120-122 to support the request and initiate one or more virtual nodes for each of the images based on the configuration. The configuration may define the sequence or order for which each of the services should be initiated from images 120-122, any addressing or communication dependencies between the virtual nodes, any commands or functions to be executed in the virtual nodes, or some other configuration. Once configured, the developer may interact with the environment to modify operations provided by the services in the virtual nodes, provide additional resources to the virtual nodes, change how the virtual nodes interact, or provide some other modifications. These modifications may then be added to the configuration associated with the developer type and/or may be used to update the image itself.

Figure 2:
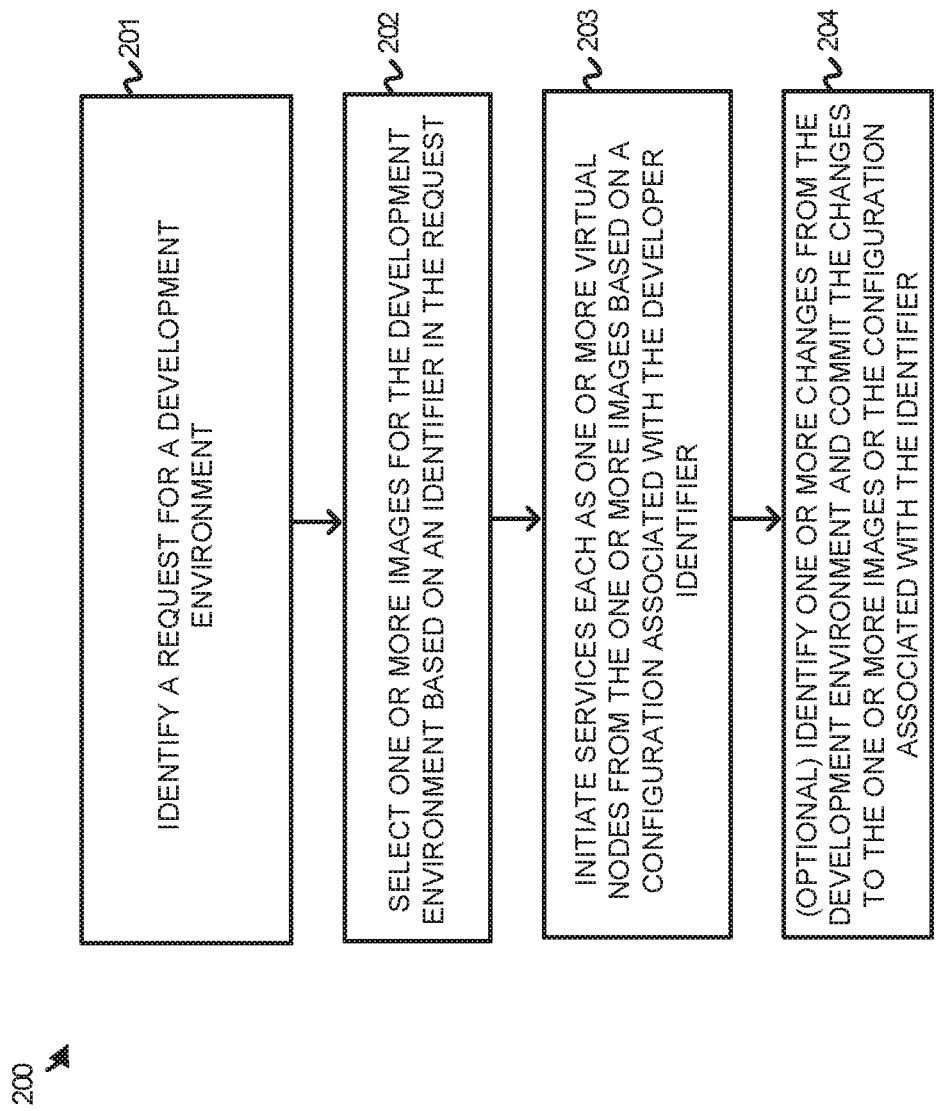
FIG. 2 illustrates a method of managing the deployment of development environments according to an implementation.

FIG. 2 illustrates a method 200 of managing the deployment of development environments according to an implementation. The steps of method 200 are referenced parenthetically in the paragraphs that follow with references to elements of developer group topology 100 of FIG. 1. Method 200 may be implemented by a computing system or systems that are capable of providing a platform for the services of a development environment, wherein each computing system may comprise a server computing system, desktop computing system, or some other computing systems.

As depicted, method 200 includes identifying (201) a request for a development environment. In some implementations, a developer may generate a request for a development environment, wherein the request may include an identifier for the type of development environment and credentials (if required) to generate the development environment. The request may be generated locally at a computing system capable of initiating the development environment or may be generated using a remote access client or application from a remote computing system. In response to the request, the method further selects (202) one or more images for the development environment from a plurality of images based on a developer identifier associated with the request. In some implementations, an organization may require a plurality of services as part of its software infrastructure, wherein different developers may be responsible for different services and operations of the software. As depicted in topology 100 of FIG. 1, an organization may include three developer groups 110-112, wherein each of the groups are allocated one or more images. These images may include software, libraries, and other elements to provide a service. In some implementations, one or more developer groups may share the use of the same service provided by an image. As a result, when changes are made in association with a service generated by the image, the changes may be reflected in the image or a configuration associated with the image for each of the corresponding developer groups.

Once the one or more images are identified, the method also initiates (203) services each as one or more virtual nodes from the one or more images based on a configuration associated with the developer identifier. In some implementations, the configuration may correspond to the individual images or the relationships between the various images for the developers. For example, the configuration for developer group 110 may include one or more scripts, commands, or other configuration processes that indicate dependencies between the services. The dependencies may include an order for which each service should be initiated from the images, addressing configuration requirements for each of the images, permissions information for each of the services or some other configuration information. In addition to the relationship dependencies between the images and the services, the configuration may also include commands, scripts, and other operations that can be executed in each of the virtual nodes that can be used to start the execution of particular operations, load libraries, or provides some other configuration to the services.

Once the configuration is complete for the development environment, the method further may identify (204) one or more changes from the development environment and commit the changes to the one or more images or the configuration associated with the identifier. As an example, a developer for developer group 110 may generate a command to be executed in a virtual node, such as a container, once the container is initiated as part of a development environment. For example, a command may be used to generate and incorporate a library or a portion of a library as part of a display provided by the container. To accommodate the change, the command may be added as part of the configuration, such that when the service is required by another developer, the same update is loaded into the configuration.

In some implementations, the update to a service may be required by multiple developer types. For example, image 121 is used to generate a service that is required by developer group 110 and developer group 112. As a result, when a modification is committed in association with the service by developer group 110, the configuration for both developer group 110 and developer group 112 may be updated to reflect the modification. The configuration modification may be used in organizing the sequence for deploying the services or may correspond to a modification in the commands or processes executed by the services.

Figure 3:
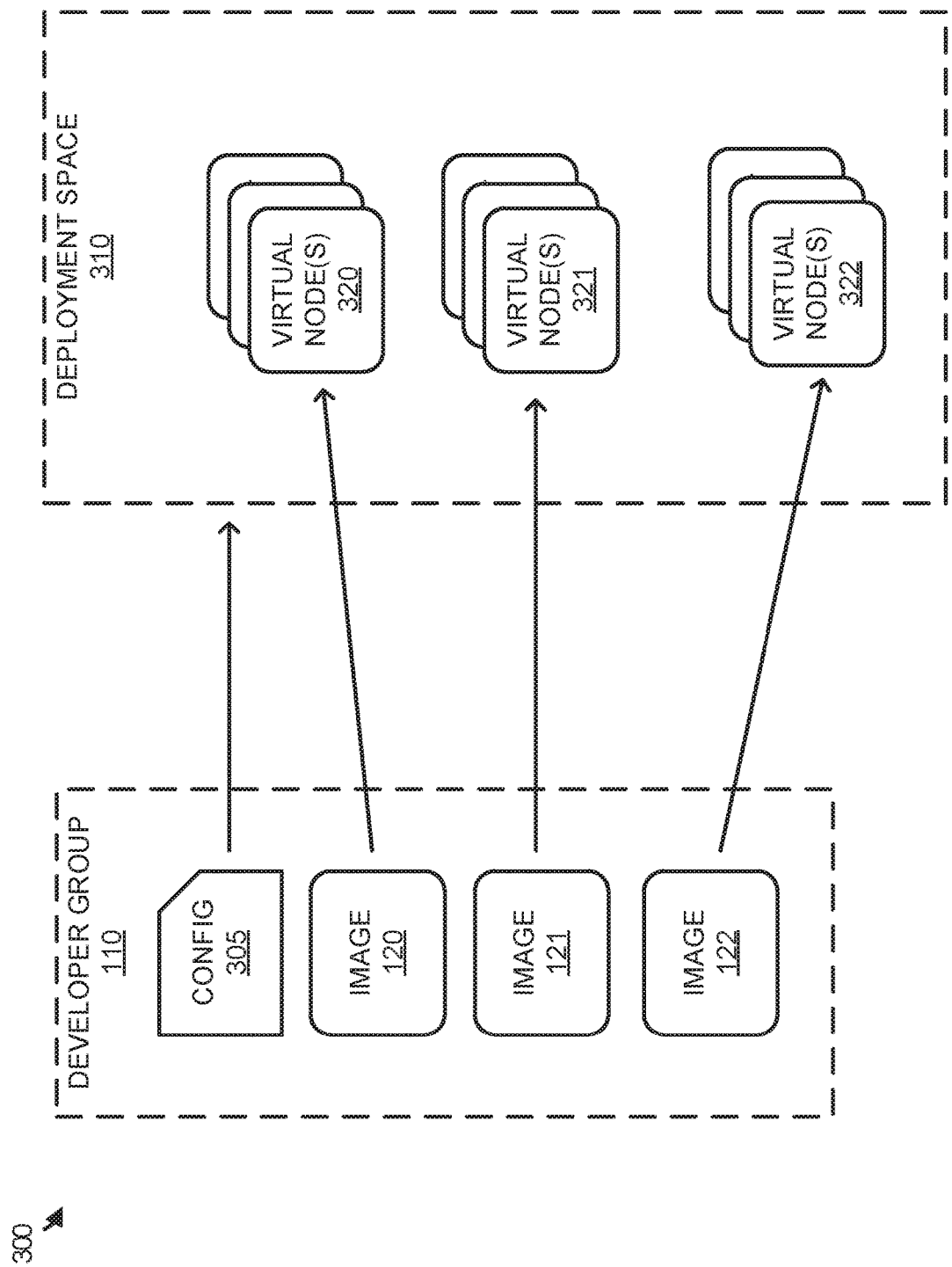
FIG. 3 illustrates an operational scenario of initiating virtual nodes for a developer according to an implementation.

FIG. 3 illustrates an operational scenario 300 of initiating virtual nodes for a developer according to an implementation. Operational scenario 300 includes developer group 110 with images 120-122 from developer group topology 100 of FIG. 1. Operational scenario 300 further includes configuration 305 and deployment space 310 with virtual nodes 320-322 that are representative of services initiated from images 120-122.

In operation, an organization may include a plurality of developers that are each responsible for different portions of the organization's software. These portions of the software may be independent or may have one or more dependent portions that are related to other developers. For example, a first developer group comprising one or more developers may share a service required by a second developer group. As a result, any change to the service by a first developer group may be required to be reflected for the second developer group.

In an implementation, a developer may request a new development environment that can be deployed in deployment space 310. Deployment space 310 may be representative of one or more server computers, desktop computers, or other computing systems with computing resources capable of supporting the services deployed from the images associated with the developer. In some examples, a developer may provide an identifier or preferences associated with the requested development environment, wherein the identifier may be used to identify the developer group or type of development environment requested. Once the group is identified, the configuring computing system may identify one or more images from an image repository associated with the developer group. The computing system may then initiate operations to deploy the development environment based on a configuration associated with the developer group.

Here, a request is generated in association with developer group 110. In response to the request, a computing system may initiate virtual nodes 320-322 to support services associated with the software contained in images 120-122. Configuration 305, associated with developer group 110, may be used to specify dependency requirements between the services, wherein the dependency requirements may indicate a sequence for which the virtual nodes should be initiated, data dependencies between the virtual nodes, such as addressing, permissions, and the like, or some other configuration information. For example, virtual node(s) 320 generated from image 120 may be required to initiate after virtual nodes 321-322 are initiated. Accordingly, configuration 305 may initiate the execution of virtual nodes 321-322 in support of the services for images 121-122 and, in response to completing the configuration of virtual nodes 321-322, initiate the execution of virtual nodes 320.

In addition to managing the initiation of the virtual nodes, configuration 305 may further include commands or operations to be performed by virtual node(s) associated with a particular service. The operations may include loading libraries, integrating information from databases, or providing some other operation within a virtual node or nodes. Thus, prior to or after initiating all of the services represented by virtual nodes 320-322, configuration 305 may initiate commands or operations within one or more of the initiated virtual nodes to implement a desired configuration for the developer group. Thus, although demonstrated as outside of the images, it should be understood that configuration 305 may be used to execute operations within the virtual nodes deployed from the images or may be implemented, in part, in the images themselves.

Once virtual nodes 320-322 are deployed in deployment space 310, the developer associated with the request may use the deployment space to update, add, or otherwise change the configuration associated with the development environment. The modifications may correspond to configuration 305, wherein the user may add, remove, or modify operations in updating the environment or may comprise some other operation in association with the environment. Once a modification is made, the configuration associated with the developer group may be updated along with any other developer groups associated with the modification. Thus, if a modification were made in relation to a command for virtual node(s) 321 and image 121, the configuration for developer group 110 may be modified along with the configuration for developer group 112 that shares the same image (and associated service).

In some examples, a developer may desire a new or different version of a particular service. To provide the updated version, the user may stop an existing development environment, and associated virtual nodes with the service, and replace one or more virtual nodes with one or more updated nodes that provide the updated service. The updated service may comprise a different image (such as an image with updated software) or may comprise an updated configuration for the previous image (e.g., with updated configuration information). When restarted, the deployment space may perform the same operations associated with configuration 305 to ensure that the new service is properly configured in association with the development environment. For example, a first developer may generate an update associated with a service and may request other developers to provide input in association with the new configuration. As a result, another developer may stop their deployment environment, select the updated configuration for the service from the first developer, and redeploy the deployment environment with the updated version of the service. The updated service may include additional features, modified features, or some other change.

Figure 4:
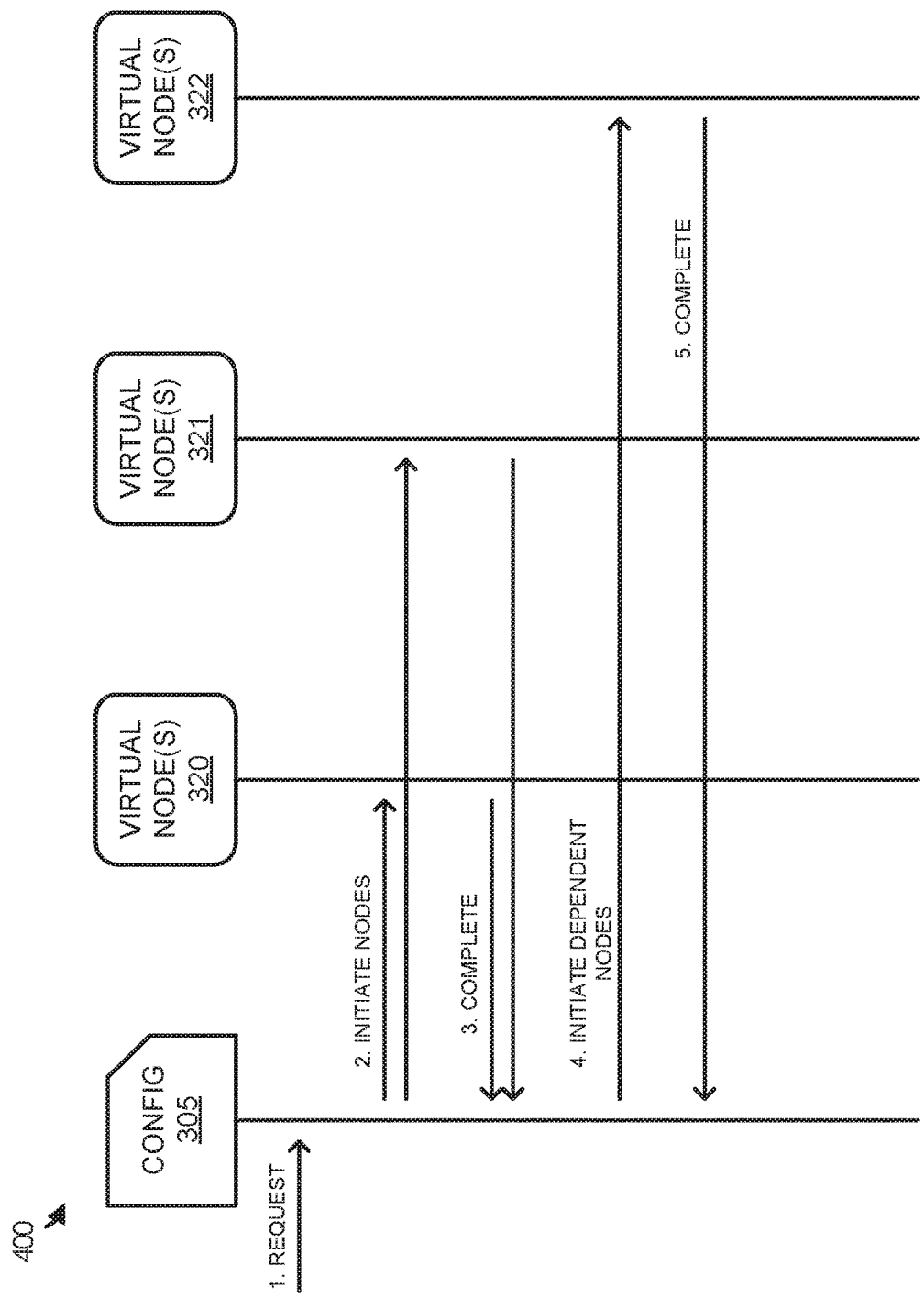
FIG. 4 illustrates a timing diagram of deploying virtual nodes according to an implementation.

FIG. 4 illustrates a timing diagram 400 of deploying virtual nodes according to an implementation. Timing diagram 400 includes configuration 305 and virtual nodes 320-322 from FIG. 3. Timing diagram 400 is representative of the deployment of a development environment based on dependencies defined by configuration 305.

In operation, a developer may request a development environment to add, modify, or fix software associated with an organization. In the request, the developer may define preferences, such as an identifier that can be used to identify services that are required by the developer. For example, the developer may identify as a front-end developer and services associated with the front-end may be initiated to create a development environment for the requesting developer. In some implementations, in initiating the services, a service may have a dependency on one or more other services. These dependencies may include the ordering in which the services are initiated, addressing or communication attributes between the services, or some other dependency. As a result, a configuration for the development environment may initiate the execution of the services based on the various requirements, wherein the configuration may be generated by one or more developers associated with the services.

Here, the developer generates a request for a development environment with services provided by virtual nodes 320-322. In response to the request, the computing system supporting the development environment identifies images associated with the request and initiates execution of one or more virtual nodes from the images based on configuration 305. Configuration 305 may include dependency requirements for the each of the services associated with the development environment, operations or commands to be executed by each of the services, or some other configuration information associated with providing the requested development environment. In the present implementation, the request initiates configuration 305, at step 1, which is used to determine the order at which each of the services are initiated in a deployment space. Once initiated, configuration 305 initiates, at step 2, virtual nodes 320-321, wherein virtual nodes 320-321 may execute in parallel without the configuration and execution of other services. In initiating execution of virtual nodes 320-321, configuration 305 may initiate operations to provide resources to the various virtual nodes (processing, memory, and the like), configure communication configurations for the services, initiate execution of one or more commands or operations, or provide some other operation to initiate the configuration of the services.

Once the configuration is completed for virtual nodes 320-321, configuration 305 may identify the completion, at step 3, and initiate dependent virtual node(s) 322, at step 4. In some implementations, configuration 305 may perform a health check on each of the services nodes to determine whether the virtual nodes are active. In other implementations, virtual nodes 320-321 may actively provide a notification to configuration 305 indicating that the configuration is complete. After completing the configuration of virtual node(s) 322, configuration 305 may identify the completion, at step 5, completing the generation of the development environment.

In some implementations, once the development environment is complete, the developer may manipulate the environment and implement changes to the environment. These changes may include incorporating libraries, executing functions, commands, or other operations, or some other change in the development environment. In some examples, the developer may commit a change to the environment, such that configuration 305 may be updated for subsequent developers. For example, a developer may generate a command to be executed as part of the service provided by virtual node(s) 321. As a result of the command, configuration 305 may include the command, such that the command will be executed during future requests for a development environment. Further, if the service is shared with other developers, the configuration for the other developers may be updated to support the changes by the developer. Thus, if a new element were added to a user interface provided by a service, any other developers associated with the same service may have corresponding configurations updated to load the new element into the user interface supplied by the service.

Figure 5:
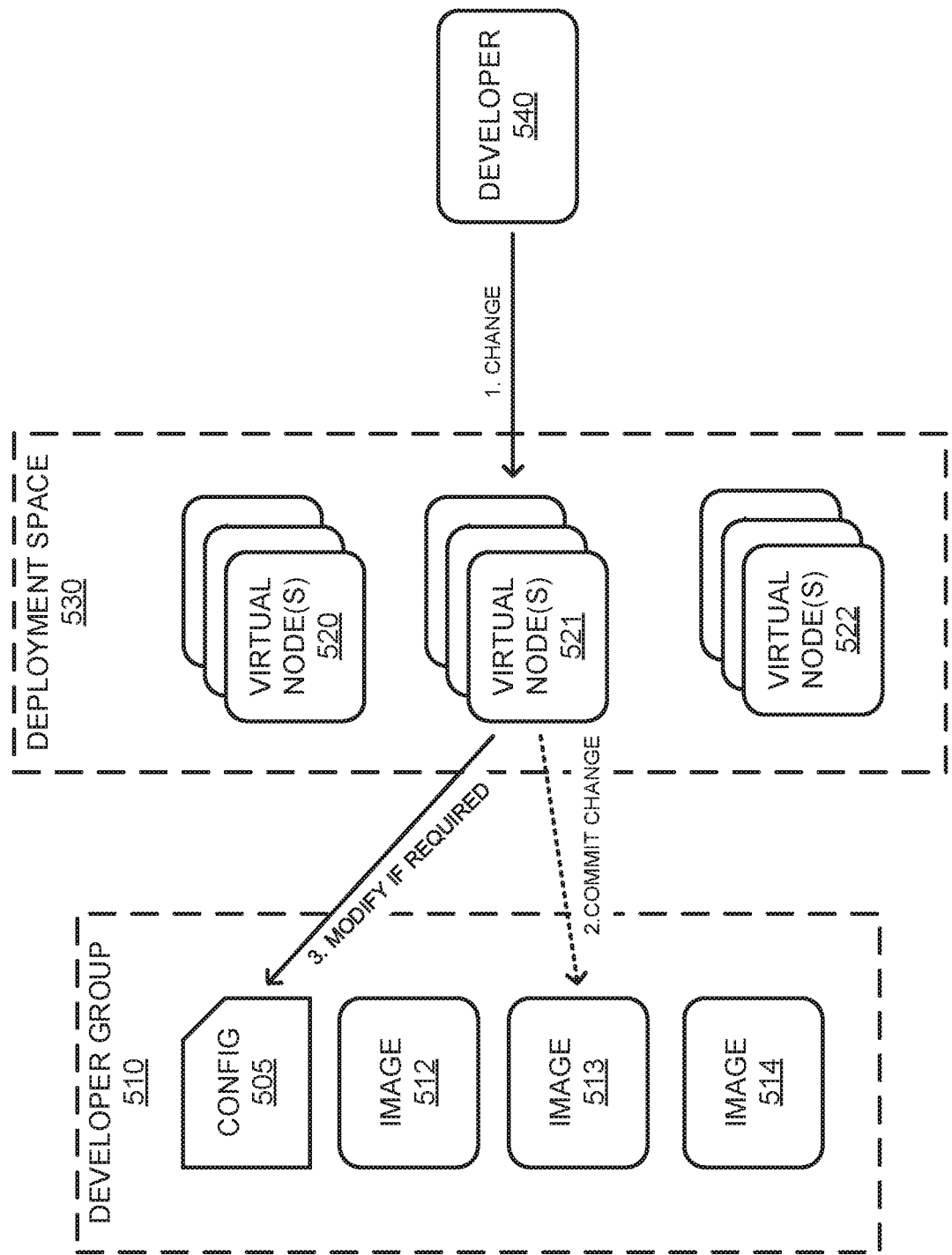
FIG. 5 illustrates an operational scenario of generating an update to a configuration according to an implementation.

FIG. 5 illustrates an operational scenario 500 of generating an update to a configuration according to an implementation. Operational scenario 500 includes developer group 510 with configuration 505 and images 512-514, deployment space 530 with virtual nodes 520-522, and developer 540.

In operation, developer 540 may generate a request for a development environment, wherein the development environment is created in deployment space 530. In particular, when a request is generated, a computing system responsible for the development environment may identify images associated with the developer, wherein the developer may provide preferences for the environment. In some examples, the developer may provide an identifier, wherein the identifier may be used to determine the images and associated services for the developer. The identifier may include an identifier of the developer group, credentials, identifiers for specific services required by the developer, or some other information to identify the development environment requested by the developer 540. Once the images are identified to support the request, configuration 505 may initiate virtual nodes 520-522 from images 512-514 to support development environment. Configuration 505 may indicate dependencies for each of the services and how the services interact, may define what operations or commands should be executed for each of the services, or may provide any other configuration information to generate the development environment for developer 540.

After the development platform is generated for developer 540, the developer may generate changes, at step 1, in association with virtual node(s) 521. For example, developer may generate a new command to be executed in the virtual node(s) to support additional functionality. After generating the change, developer 540 may determine that the change should be made available to other developers that employ the same service provided by image 513 and the virtual nodes. Consequently, developer 540 may commit a change in association with image 513, permitting a modification to configuration 505. For example, developer 540 may generate a command that incorporates a new column in a user interface provided by virtual node(s) 521. If desired, developer 540 may commit the new command to be part of the configuration of the service. Thus, when a new development environment is requested, the same command may be automatically employed as part of configuring the development environment.

In some examples, a service may be shared by multiple developer groups, such as a database service that needs to be accessed by multiple developers. To ensure that each developer is provided with a correct version of the service. The configuration operation associated with the other developers may be updated along with the configuration for developer group 505. As an example, when a new command is added by developer 540 to provide an updated version of the service, the command may be implemented when the service is initiated by other developers that use the same service. Accordingly, when a request is generated by a developer from a different developer group, the computing system may identify image 513 for the developer and initiate the image in accordance with the change from developer 540.

In some implementations, different developers may develop using different versions of a particular image or different configurations associated with a particular image. For example, developer 540 may be associated with image 513 that is deployed in accordance with configuration 505, while a second developer may also be associated with image 513 that is deployed in accordance with a different configuration. If developer 540 desired to test out the configuration used by the second developer, developer 540 may pause the execution of virtual nodes 520-522 and reinitiate the virtual nodes using the configuration associated with the second developer. The second configuration may introduce additional features, fixes to known issues, or provide some other modification. Similar operations may also be performed to change different versions of an image, such as changing a first version of an image to a subsequent version of the image. These operations may include stopping operations of the development environment, replacing the older version of the image with the updated version of the image, and initiating the development environment with the updated version of the image according to the configuration.

Figure 6:
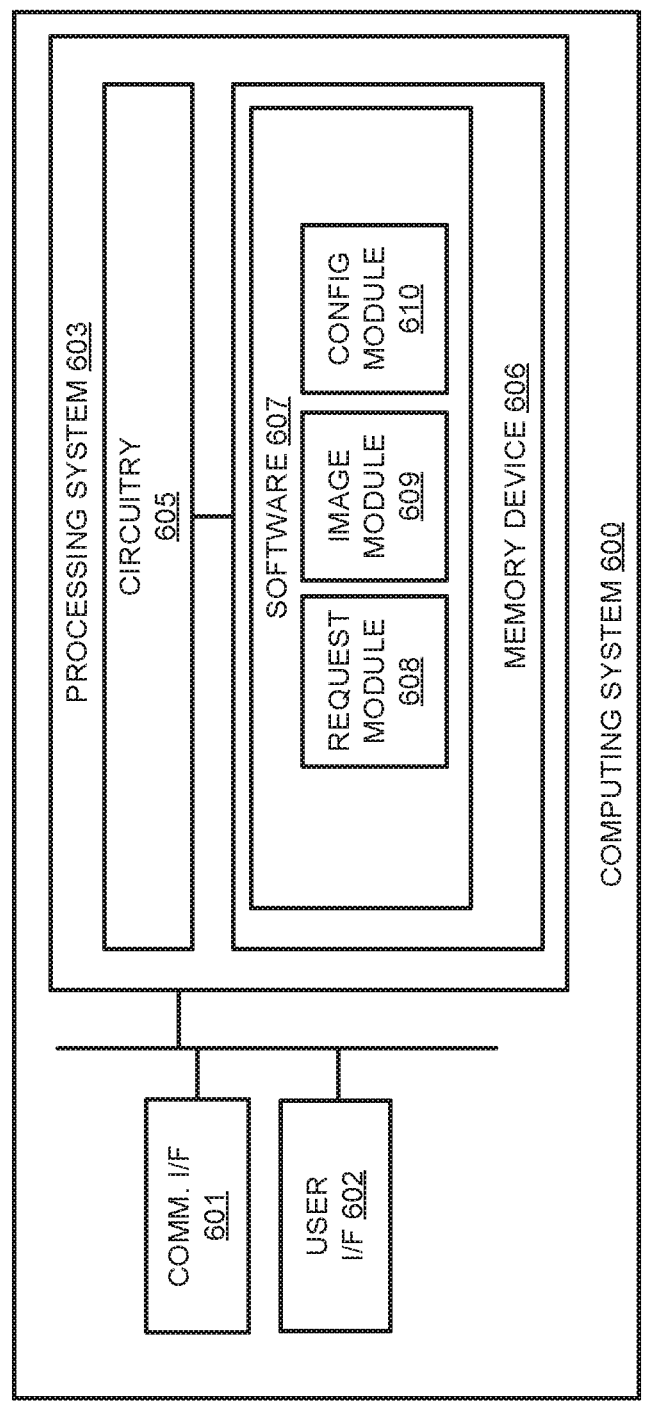
FIG. 6 illustrates a computing system to manage the deployment of development environments according to an implementation.

FIG. 6 illustrates a computing system 600 to manage the deployment of development environments according to an implementation. Computing system 600 is representative of any computing system or systems with which the various operational architectures, processes, scenarios, and sequences disclosed herein for a development environment computing system may be implemented. Computing system 600 is an example computing system capable of storing images for various developers and providing a platform to deploy services from the images. Computing system 600 comprises communication interface 601, user interface 602, and processing system 603. Processing system 603 is linked to communication interface 601 and user interface 602. Processing system 603 includes processing circuitry 605 and memory device 606 that stores operating software 607. Computing system 600 may include other well-known components such as a battery and enclosure that are not shown for clarity. Computing system 600 may comprise one or more server computing systems, desktop computing systems, laptop computing systems, or any other computing system, including combinations thereof.

Communication interface 601 comprises components that communicate over communication links, such as network cards, ports, radio frequency (RF), processing circuitry and software, or some other communication devices. Communication interface 601 may be configured to communicate over metallic, wireless, or optical links. Communication interface 601 may be configured to use Time Division Multiplex (TDM), Internet Protocol (IP), Ethernet, optical networking, wireless protocols, communication signaling, or some other communication format—including combinations thereof.

User interface 602 comprises components that interact with a user to receive user inputs and to present media and/or information. User interface 602 may include a speaker, microphone, buttons, lights, display screen, touch screen, touch pad, scroll wheel, communication port, or some other user input/output apparatus—including combinations thereof. User interface 602 may be omitted in some examples. User interface 602 may be used to obtain developer input indicating a development environment request and provide an interface to interact with the development environment.

Processing circuitry 605 comprises microprocessor and other circuitry that retrieves and executes operating software 607 from memory device 606. Memory device 606 comprises a non-transitory storage medium, such as a disk drive, flash drive, data storage circuitry, or some other memory apparatus. Processing circuitry 605 is typically mounted on a circuit board that may also hold memory device 606 and portions of communication interface 601 and user interface 602. Operating software 607 comprises computer programs, firmware, or some other form of machine-readable processing instructions. Operating software 607 includes request module 608, image module 609, and configuration module 610, although any number of software modules may provide the same operation. Operating software 607 may further include an operating system, utilities, drivers, network interfaces, applications, or some other type of software. When executed by processing circuitry 605, operating software 607 directs processing system 603 to operate computing system 600 as described herein.

In at least one implementation, request module 608 directs processing system 603 to identify a request for a development environment. In response to the request, image module 609 directs processing system 603 to select one or more images for the development environment from a plurality of images based on a developer identifier associated with the request. For example, an organization may include multiple developer groups, wherein each of the groups may require access to different services. When a developer requests a new environment, image module 609 may direct processing system 603 to identify services required by the developer and may select images that can be used to deploy the required services.

Once the images are selected, configuration module 610 directs processing system 603 to initiate one or more services as one or more virtual nodes from the one or more images based on a configuration associated with the developer identifier. The configuration may define how each of the services should interact with one another, may define operations or commands to be executed by each of the services, or may provide any other configuration information associated with the services. For example, a configuration may indicate that a first service may be required to be initiated prior to the second service. As a result, when a development environment is requested, the configuration may initiate the first service and, once the first service is initiated, initiate execution of the one or more virtual nodes for the second service. Other configuration operations may also include configuring communication parameters to communicate with each of the services, executing one or more commands or functions, or providing some other operation to configure the development environment.

After generating the development environment, the developer may generate modifications or changes to the development environment, wherein the changes may include adding commands or functions to a service, changing libraries in association with a service, or providing some other modification or change in the environment. In some implementations, the developer may desire that the changes be implemented for other developers that share the same service. As a result, configuration module 610 may direct processing system 603 to update a configuration, such that the command or function is implemented when providing a new development environment. Thus, if a command introduced a new element to a user interface, other developers that share the service (or image that generates the service) may be provided with the same interface derived from the executed command Although illustrated in the previous examples as outside of the images, it should be understood that at least a portion of the configuration for a development environment may exist within an image.

In some implementations, a developer may desire to change from a first version of an image to a second version of an image. For example, a developer may be working with a different version of an image and may request another developer to test out the new version of the image. In response to the request, a current development environment may be stopped with the older version of the image, computing system 600 may identify the new version of the image (e.g., specified by the developer), and restart the development environment using the new version of the image in place of the older version.

Similar to the operations above, a developer may desire to change a configuration for an image, or group of images, to a different configuration. For example, a first developer may initiate a development environment that executes first commands or functions for a particular service, while a second developer may initiate a second development environment that executes second commands or functions for the same service. To change the configuration of the first development environment, the developer may stop the execution of the services, identify a replacement configuration (which may exist as part of a separate image or set of images), and restart the development environment according to the new configuration. The configuration may be used to configure dependencies between the various services, may be used to initiate functions or commands in the services, or may be used to provide some other operation.

The included descriptions and figures depict specific implementations to teach those skilled in the art how to make and use the best mode. For the purpose of teaching inventive principles, some conventional aspects have been simplified or omitted. Those skilled in the art will appreciate variations from these implementations that fall within the scope of the invention. Those skilled in the art will also appreciate that the features described above can be combined in various ways to form multiple implementations. As a result, the invention is not limited to the specific implementations described above, but only by the claims and their equivalents.

What is claimed is:

1. A method comprising:
   identifying a request for a development environment;
   selecting images for the development environment from a plurality of images based on a developer identifier associated with the request;
   identifying one or more dependencies between the plurality of images based on a configuration associated with the developer identifier; and
   initiating services in an order according to the dependencies, each service initiated as one or more virtual nodes from the images based on a configuration associated with the developer identifier.

2. The method of claim 1, wherein initiating services in an order according to the dependencies, each service initiated as one or more virtual nodes from the images based on a configuration associated with the developer identifier comprises executing a command or function in a virtual node of at least one of the services.

3. The method of claim 1, wherein the virtual nodes comprise containers.

4. The method of claim 1, wherein the configuration comprises one or more command or functions to be executed in at least one virtual node of the virtual nodes.

5. The method of claim 1 further comprising:
   obtaining an update to the configuration associated with an image of the plurality of images for a service;
   identifying one or more other developer identifiers associated with the image; and
   updating one or more other configurations associated with one or more other developer identifiers.

6. The method of claim 1 further comprising:
   identifying a second request for a second development environment;
   selecting one or more second images for the second development environment from the plurality of images based on a second developer identifier associated with the second request, wherein the one or more second images and the images share at least one image;
   initiating second services each as one or more second virtual nodes from the one or more second images based on a second configuration associated with the second developer identifier.

7. The method of claim 1 further comprising:
   stopping the services;
   identifying an updated configuration to the configuration; and
   in response to identifying the updated configuration, restart the services from the images based on the updated configuration.

8. The method of claim 1 further comprising:
   identifying a replacement image for an image of the images;
   stopping the services; and
   restarting the services with the replacement image in place of the image based on the configuration.

9. A computing apparatus comprising: a storage system; a processing system operatively coupled to the storage system; and program instructions stored on the storage system that, when executed by a processing system, direct the processing system to identify a request for a development environment; select images for the development environment from a plurality of images based on a developer identifier associated with the request; identify one or more dependencies between the plurality of images based on a configuration associated with the developer identifier; and initiate services in an order according to the dependencies, each service initiated as one or more virtual nodes from the images based on a configuration associated with the developer identifier.

10. The computing apparatus of claim 9, wherein initiating services in an order according to the dependencies, each service initiated as one or more virtual nodes from the images based on a configuration associated with the developer identifier comprises executing a command or function in a virtual node of at least one of the services.

11. The computing apparatus of claim 9, wherein the virtual nodes comprise containers.

12. The computing apparatus of claim 9, wherein the configuration comprises one or more commands or functions to be executed in at least one virtual node of the virtual nodes.

13. The computing apparatus of claim 9, wherein the program instructions further direct the processing system to:
   obtain an update to the configuration associated with an image of the plurality of images for a service;
   identify one or more other developer identifiers associated with the image; and
   update one or more other configurations associated with the one or more other developer identifiers.

14. The computing apparatus of claim 9, wherein the program instructions further direct the processing system to:
   identify a second request for a second development environment;
   select one or more second images for the second development environment from the plurality of images based on a second developer identifier associated with the second request, wherein the one or more second images and the images share at least one image;

initiate second services each as one or more second virtual nodes from the one or more second images based on a second configuration associated with the second developer identifier.

15. The computing apparatus of claim 9, wherein the program instructions further direct the processing system to:
   stop the services;
   identify an updated configuration to the configuration; and
   in response to identifying the updated configuration, restart the services from the images based on the updated configuration.

16. The computing apparatus of claim 9, wherein the program instructions further direct the processing system to:
   identify a replacement image for an image of the images;
   stop the services; and
   restart the services with the replacement image in place of the image based on the configuration.

17. An apparatus comprising: a processing system; a storage system; program instructions stored on the storage system that, when executed by the processing system, direct the processing system to: identify a request for a development environment; select images for the development environment from a plurality of images based on a developer identifier associated with the request; identify one or more dependencies between the images based on a configuration associated with the developer identifier; and initiate services from the images in an order specified by the dependencies.

18. The apparatus of claim 17, wherein each of the services comprise one or more containers.

* * * * *